US012625602B2

(12) United States Patent
Wortmann

(10) Patent No.: US 12,625,602 B2
(45) Date of Patent: May 12, 2026

(54) METHOD FOR USER INTERACTION FOR DATA MANIPULATION IN A CAE/CAD SYSTEM

(71) Applicant: AutoForm Engineering GmbH, Pfäffikon (CH)

(72) Inventor: Christian Wortmann, Pfäffikon (CH)

(*) Notice: Subject to any disclaimer, the term of this patent is extended or adjusted under 35 U.S.C. 154(b) by 56 days.

(21) Appl. No.: 17/811,444

(22) Filed: Jul. 8, 2022

(65) Prior Publication Data

US 2023/0042651 A1    Feb. 9, 2023

(30) Foreign Application Priority Data

Jul. 8, 2021    (CH) ............................... 070035/2021

(51) Int. Cl.
  *G06F 3/04847*    (2022.01)
  *G06F 30/12*    (2020.01)
(52) U.S. Cl.
  CPC .......... *G06F 3/04847* (2013.01); *G06F 30/12* (2020.01)
(58) Field of Classification Search
  CPC ...... G06F 3/048; G06F 3/04847; G06F 30/12; G06F 30/10–18
  See application file for complete search history.

(56) References Cited

U.S. PATENT DOCUMENTS

| | | | |
|---|---|---|---|
| 10,984,606 B1 | 4/2021 | Dalmia | |
| 11,423,193 B1* | 8/2022 | Perkins | ................... G06F 30/17 |
| 2010/0318929 A1* | 12/2010 | Hilton | ................... G06F 3/0482 |
| | | | 715/848 |
| 2011/0214091 A1* | 9/2011 | Nicol | ................... G06F 3/0483 |
| | | | 715/838 |

(Continued)

FOREIGN PATENT DOCUMENTS

| | | |
|---|---|---|
| EP | 3798894 A1 | 3/2021 |
| WO | WO2019084082 A1 | 5/2019 |

OTHER PUBLICATIONS

GoEngineer. Solidworks CAM and CAMWorks Tutorial—An Introduction to Generating CNC Code within Solidworks. YouTube. Feb. 5, 2020. <https://www.youtube.com/watch?v=jWCUN8T-zq4> (Year: 2020).*

(Continued)

*Primary Examiner* — Liang Y Li
(74) *Attorney, Agent, or Firm* — Oppedahl Patent Law Firm LLC

(57)    ABSTRACT

A method serves for user interaction in a CAE/CAD system for designing physical parts, the parts being components shaped by a forming process or tools used in a forming process. The method comprises displaying to a user:

a graphical user interface (2) with a model display region (3), and a control region (5) for displaying widgets (7) for modifying control parameters controlling operation of the CAE/CAD system, and, on the basis of user input actions in the control region (5), specifying control parameters (14), modifying the part model.

Each control parameter (15) corresponds to a geometric feature (17) of the graphical model representation (4) that is displayed in the model display region. For each control parameter (15), its corresponding widget (7) and geometric feature (17) are visually marked by visual markers (17, 18) in the same manner, allowing to differentiate them from those of other control parameters (15).

10 Claims, 4 Drawing Sheets

(56) References Cited

U.S. PATENT DOCUMENTS

| | | | |
|---|---|---|---|
| 2012/0123747 A1* | 5/2012 | Kubli | G06F 30/23 |
| | | | 703/2 |
| 2013/0036401 A1* | 2/2013 | Lininger | G06F 30/17 |
| | | | 717/109 |
| 2016/0253081 A1* | 9/2016 | Bains | G06F 3/04842 |
| | | | 715/771 |
| 2019/0073438 A1* | 3/2019 | Mariappasamy | G06F 30/23 |
| 2019/0325089 A1* | 10/2019 | Golparvar-Fard | G06T 19/003 |
| 2020/0019649 A1 | 1/2020 | Kumar | |
| 2021/0149377 A1 | 5/2021 | Auh | |
| 2022/0083974 A1* | 3/2022 | Fleming | G06Q 30/0633 |

OTHER PUBLICATIONS

Siemens. Siemens NX Documentation. 2019. Siemens. <https://docs.plm.automation.siemens.com/tdoc/nx/1847/nx_help/#uid: index> (Year: 2019).*

Cebesoy, Emre Halil. "Adding Attribute Value to Assembly Navigator Column". Jul. 28, 2015. YouTube. https://www.youtube.com/watch?v=uhVdCY_f1NI (Year: 2015).*

Lei et al: "Unified 3-D Interactive Human-Centered", IEEE Trans on Ind Informatics, vol. 17, No. 7, Aug. 25, 2020, pp. 4777-4787.

* cited by examiner

METHOD FOR USER INTERACTION FOR DATA MANIPULATION IN A CAE/CAD SYSTEM

Swiss patent application number 070035/2021, filed 8 Jul. 2021, is incorporated herein for all purposes.

The invention relates to the field of Computer Aided Engineering and/or Computer Aided Design (CAE/CAD) systems, and in particular to a method modifying a parametric model in a CAE/CAD system as described in the preamble of the corresponding independent claims.

BACKGROUND

In CAE/CAD systems it often is the case that a user repeatedly performs user interface actions to choose objects or elements being modelled, to choose operations to be performed on these objects or elements, to choose parameters for these operations, and finally to trigger execution of the operations. It can also be the case that the parameters specify properties of the objects or elements themselves (rather than an operation affecting the object). Parameters can be entered and modified using a variety of user interface control elements, commonly called widgets. Typically, the widgets are displayed in a graphical user interface in a control region, and a graphical model representation of an object being modelled is displayed in a model display region. There exist operations or elements with more than one parameter, and it can be the case that these parameters are of a same type, such as a linear dimension, an angle, a radius, etc. It can further be the case that the parameters are not readily distinguishable from one another in the context of the object being modelled. For example, the parameters refer to two ends of a linearly extended feature, respectively, or to a front and back side of an object, or to a top and bottom of an object. As the object being modelled is displayed in the model display region, a user must know which part or element of the model shown in the display is associated with a particular parameter of the element or operation affecting the element. The user may modify a parameter using the widget and see the effect of the modification in the model display region. However, this is inefficient. There is a need to assist a user in differentiating between control elements that cannot be unambiguously assigned to an element of the model.

It is therefore an object of the invention to create a method for user interaction in a CAE/CAD system of the type mentioned initially, which overcomes the disadvantages mentioned above.

SUMMARY OF THE INVENTION

These objects are achieved by a method for user interaction in a CAE/CAD system according to the independent claim.

The term "CAE/CAD system" used herein is understood to denote Computer Aided Engineering systems and/or Computer Aided Design systems.

The method serves for user interaction in a CAE/CAD system for designing physical parts, the parts being components shaped by a forming process, parts assembled in an assembly operation, or tools used in a forming or an assembly process, a part being represented in the CAE/CAD system by a computer-based part model, and the method being performed by a processing unit of the CAE/CAD system. The method comprises the steps of:

displaying to a user, on a computer display, a graphical user interface, the graphical user interface comprising a model display region for displaying a graphical model representation of the part model, a control region for displaying widget sets for modifying control parameter sets controlling operation of the CAE/CAD system, on the basis of user input actions in the control region, specifying control parameter sets, modifying the part model.

Therein, for two or more of the control parameters sets that are modifiable, each control parameter set corresponds to a geometric feature of the graphical model representation that is displayed in the model display region, and for each of the two or more control parameter sets, its corresponding widget set and its corresponding geometric feature are visually marked by visual markers in the same manner, and in a different manner than widget sets and geometric features corresponding to other control parameter sets.

This visualizes the correspondence between the widget set and the geometric feature controlled by the widget set. This allows the user that wishes to modify a geometric feature to select widgets within the correct widget set, which would otherwise be indistinguishable from the other widgets associated with the graphical model representation. This in turn allows for a more efficient user interaction: the user immediately knows which widget set to use in order to modify a particular geometric feature seen in the graphical model representation. A parameter controlled by means of a widget can be a parameter of a geometric feature itself, and thereby affect the feature directly. Alternatively, a parameter can be a parameter of an operation that is applied to the feature and in this way affects the feature.

In embodiments, the two or more geometric features whose correspondence with the respective widgets would otherwise be not be clear, are of the same type. For example, feature types can be points, lines or planes. Depending on the type of the geometric feature and the context of the geometric feature within the part model, the corresponding control parameters can differ.

Typically, a control parameter controls a property of the geometric feature within the part model, or of an operation affecting the geometric feature. Such a property can be, for example, a position along a curve, or an orientation with reference to a coordinate system or another geometric feature, a size, etc. A control parameter can specify, for example, a length, an angle, a radius, a control flag, an algorithm, etc.

In embodiments, the method comprises the steps of, for each of the two or more control parameter sets:

displaying within the control region and associated with the control parameter set's widget set, a control-related visual marker, displaying within the model display region and associated with the geometric feature corresponding to the control parameter set, a display-related visual marker, wherein the control-related marker and the display-related marker share one or more visual properties, distinguishing them from markers associated with other control parameter sets.

In embodiments, the correspondence between a control parameter and a geometric feature is a one-to-one correspondence, and the correspondence between a control parameter and a widget is a one-to-one correspondence, and thus there also is a one-to-one correspondence between the geometric feature and the widget.

Control parameters that respectively correspond to different geometric features of the same type that need to be distinguished from one another shall be referred to as control parameter group. Thus, control parameters of the same control parameter group control the same property of the respective geometric features. For example, in one control parameter group, this property is a length. In another, this is an angle, etc.

In embodiments, the correspondence between a control parameter and a geometric feature is a many-to-one correspondence, that is, one geometric feature is associated with more than one control parameters. These control parameters corresponding to the same geometric feature shall be referred to as a control parameter set, and the respective widgets as a widget set. Then the correspondence between a control parameter set and a geometric feature is a one-to-one correspondence, and the correspondence between a control parameter set and a widget set is a one-to-one correspondence, and thus there also is a one-to-one correspondence between the geometric feature and the widget set.

A control parameter set controls a set of properties of a respective geometric feature. For example, the first parameter of a control parameter set can control a length, and a second parameter specifies an algorithm that uses this length in the context of the geometric feature. In such a case, a control parameter group can comprise two or more control parameter sets, each control parameter set having the same composition of control parameters. A composition specifies that there is at least a first parameter of a first type, and optionally a second parameter of a second type, a third parameter of a third type, etc.

Thus, in embodiments, the two or more control parameter sets have the same composition of control parameters.

Where there is a one-to-one correspondence between a control parameter and a geometric feature, this can be considered a special case of a many-to-one correspondence, in which the control parameter set comprises a single control parameter, and the widget set comprises a single widget.

In embodiments, with each control parameter set comprising N control parameters, N being an integer number larger than or equal to one, it is possible to number the control parameters of each parameter set with the numbers from one to N such that over all control parameter sets the control parameters numbered with the same n are of a same type.

Expressed in another way: there being M control parameter sets (forming a control parameter group), with each control parameter set comprising N control parameters, M and N being integer numbers larger than or equal to two, there can be formed further sets of control parameters (not to be confused with the control parameter sets), each such further set comprising exactly one control parameter from each control parameter set, and all control parameters of each such further set being of a same type.

In embodiments, a control parameter's type corresponds to the control parameter specifying one of a length, an angle, a radius, a control flag, or an algorithm.

In embodiments, visual properties of visual markers comprise at least one of shape, colour, brightness and pattern. A shape or pattern can represent a letter or number or other symbol.

In embodiments, a visual property is a blinking frequency.

In embodiments, the method comprises the step of displaying a visual marker associated with a widget set or a geometric feature when a mouse event takes place on the widget set or the geometric feature.

In embodiments, the method comprises the step of modifying a visual property of a widget or of a control-related visual marker in in the control region when a mouse event occurs at its corresponding geometric feature.

In embodiments, the method comprises the step of modifying a visual property of a geometric feature or of a display-related visual marker in the model display region when a mouse event occurs at its corresponding widget.

In embodiments, the mouse event is a mouse click event or wherein it is a mouseover event.

A data processing system can be programmed to perform the method for user interaction in a CAE/CAD system. In an embodiment, a computer program product for user interaction in a CAE/CAD system is loadable into an internal memory of a digital computer or a computer system, and comprises computer-executable instructions to cause one or more processors of the computer or computer system execute the method for user interaction in a CAE/CAD system. In another embodiment, the computer program product comprises a computer readable medium having the computer-executable instructions recorded thereon. The computer readable medium preferably is non-transitory; that is, tangible. In still another embodiment, the computer program is embodied as a reproducible computer-readable signal, and thus can be transmitted in the form of such a signal. A method of manufacturing a non-transitory computer readable medium, comprises the step of storing, on the computer readable medium, computer-executable instructions which when executed by a processor of a computing system, cause the computing system to perform the method for user interaction in a CAE/CAD system.

Further embodiments are evident from the dependent patent claims.

DESCRIPTION OF THE DRAWINGS

The subject matter of the invention will be explained in more detail in the following text with reference to exemplary embodiments which are illustrated in the attached drawings, which schematically show.

In principle, identical parts are provided with the same reference symbols in the figures.

DETAILED DESCRIPTION

Figures 1, 2:
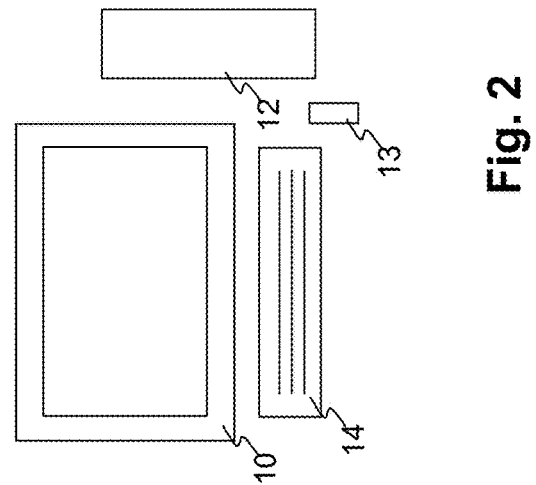
FIG. 1 a graphical user interface.
FIG. 2 a computer providing the graphical user interface.

FIG. 1 schematically shows a computer display 10. A graphical user interface 2 of a CAE/CAD system is displayed on the computer display 10. The graphical user interface 2 comprises a model display region 3, on which a graphical representation of computer model of an object being designed is displayed. The graphical user interface 2 further comprises a control region 5 in which widgets 7 defining parameters of the computer model or of operations performed on the computer model are displayed. The widgets 7 can be arranged in containers 6 according to various GUI paradigms. According to certain GUI paradigms, a screen or display area covered by a widget 7 or a set of widgets 8 being displayed can vary. For example, in an accordion container 6 widgets 7 or widget sets 8 are arranged vertically above one another. Each widget 7 or widget set 8 can be expanded or collapsed in the vertical direction, or they can be displayed in the container 6 or removed, depending on the state of the graphical user interface 2. The widgets 7 can implement GUI controls, that is, visual elements which allow the user to enter, change or delete data. Such controls can be input fields, sliders, check boxes, radio buttons, up/down arrows (spinners) and the like. They are not shown in detail in FIG. 1.

Further, well known, elements of a computer system that can be used to control the computer system and the CAE/CAD system running on it are, in addition to the computer display 10, a processing unit 12, a pointing device 13 and an input device such as a keyboard 14, as shown in FIG. 2.

As a user interacts with the graphical user interface 2, a typical sequence of interaction can comprise the user selecting an object or feature of an object or element being modelled and the user selecting parameters of the object to be modified, or an operation to be performed on the object. The operation is also controlled by parameters.

Figure 3:
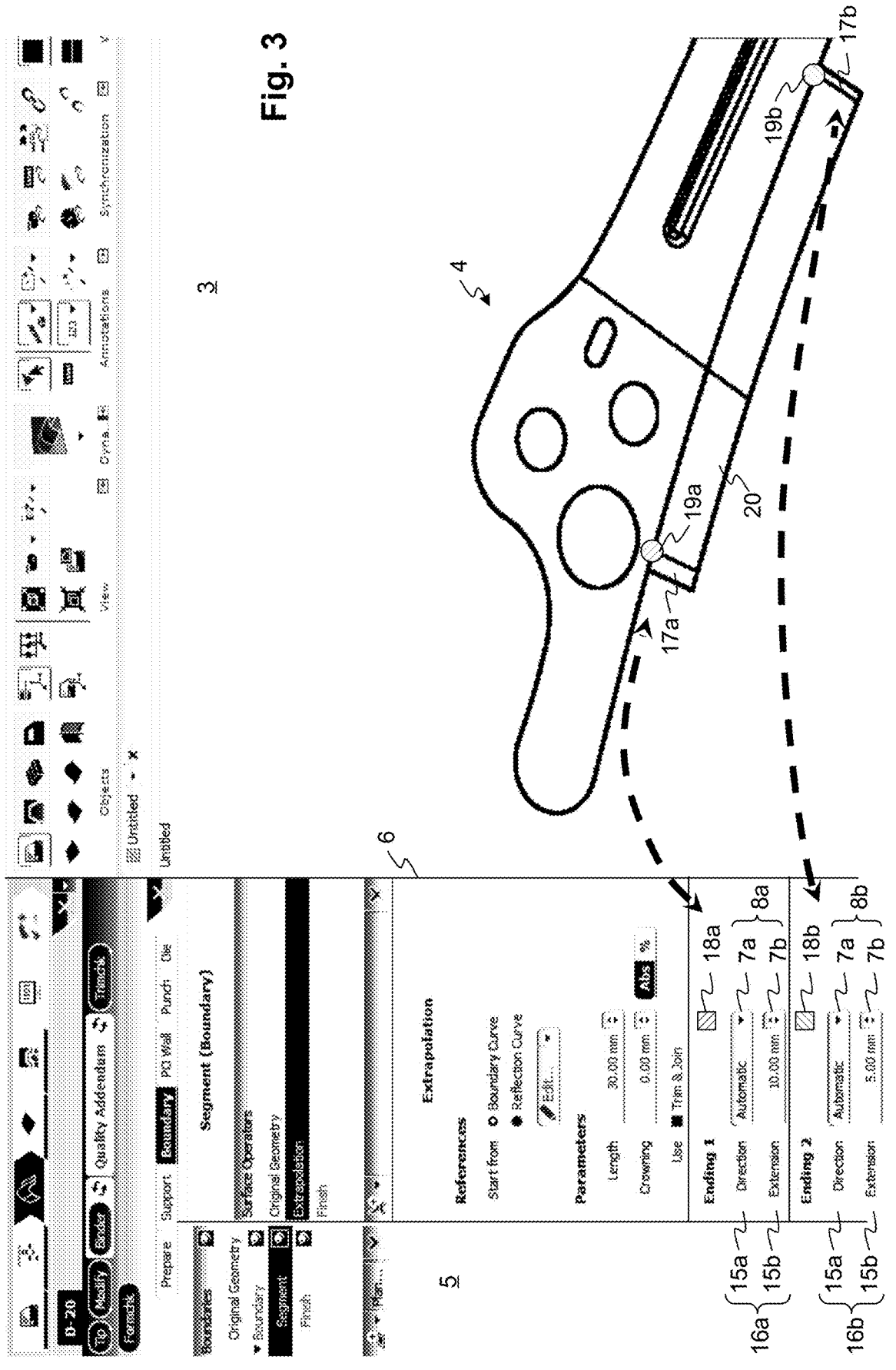
FIG. 3 a first example of visual markers associated with widget sets and corresponding geometric features, in which each widget set comprises two widgets, each for an associated parameter.

FIG. 3 shows a graphical user interface 2 with the structure as presented in FIG. 1, with exemplary widgets 7a, 7b allowing the user to interact with the CAE/CAD system. In the state of the graphical user interface 2 as shown, a surface element 20 running along a side of the part shown by its graphical model representation 4 has been selected. An operation to be performed on the surface element 20 is an extrapolation of the surface element 20 in both directions along the part. At each ending of the surface element 20, a corresponding geometric feature 17a, 17b is modified by this extrapolation. The modification is controlled by first control parameter 15a, being an extension value, specifying a length by which the surface element 20 is extended ("10.00 mm" at one ending, "5.00 mm" at the other ending), and a second control parameter 15b, specifying how a direction in which it is extended is to be determined ("Automatic" at both endings). The first and second control parameter 15a, 15b are entered or modified using a respective first and second widget 7a, 7b. For the first ending and geometric feature 17a, the first and second control parameter 15a, 15b form a first control parameter set 16a, and the corresponding first and second widget 7a, 7b form a first widget set 8a. Likewise, the second ending with second geometric feature 17b corresponds to a second control parameter set 16b and second widget set 8b. The first and second widget set 8a, 8b have the same composition in that they both comprise one widget for a first control parameter 15a and one widget for a second control parameter 15b as described above. Thus, they cannot be distinguished from one another and it is not evident which widget set 8a, 8b is associated with which geometric feature 17a, 17b.

In order to provide this information, each widget set 8a, 8b is visually associated with a corresponding control-related visual marker 18a, 18b, and each geometric feature 17a, 17b is visually associated with a corresponding display-related visual marker 19a, 19b. A first control-related visual marker 18a and first display-related visual marker 19a share one or more visual properties. A second control-related visual marker 18b and second display-related visual marker 19b share one or more visual properties that differ from those of the first visual markers 18a, 19a. In FIG. 3, this is shown by different hatching of the visual markers. Other visual properties are shape, colour, brightness or other types of patterns than hatching. The correspondence expressed by the shared visual properties is indicated by dashed double arrows (which are not part of the graphical user interface 2).

The first control parameter set 16a and second control parameter set 16b together form a control parameter group. More generally, the control parameter group comprises the control parameter sets having the same composition (and that would be indistinguishable except for the visual markers).

Figure 4:
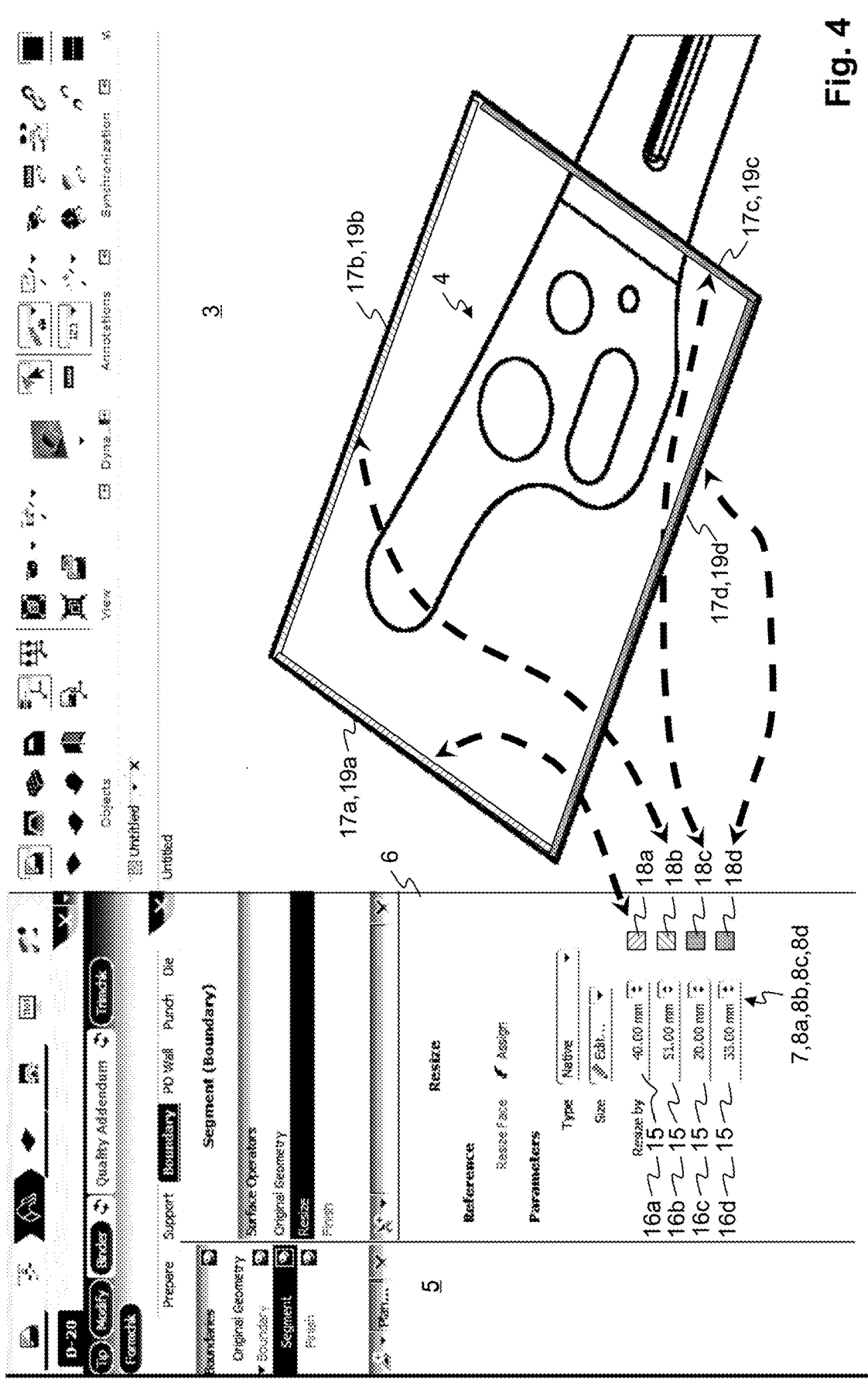
FIG. 4 a second example, in which each widget set comprises a single widget.

FIG. 4 shows a second example, with first through fourth geometric features 17a, 17b, 17c, 17d and corresponding first through fourth control parameter sets 16a, 16b, 16c, 16d. Each control parameter set 16a, 16b, 16c, 16d comprises a single control parameter 15 and corresponding widget sets 8a, 8b, 8c, 8d each comprise a single widget 7. The correspondence between widget sets and geometric features is indicated by respective first through fourth control-related visual markers 18a, 18b, 18c, 18d and first through fourth display-related visual markers 19a, 19b, 19c, 19d.

Figure 5:
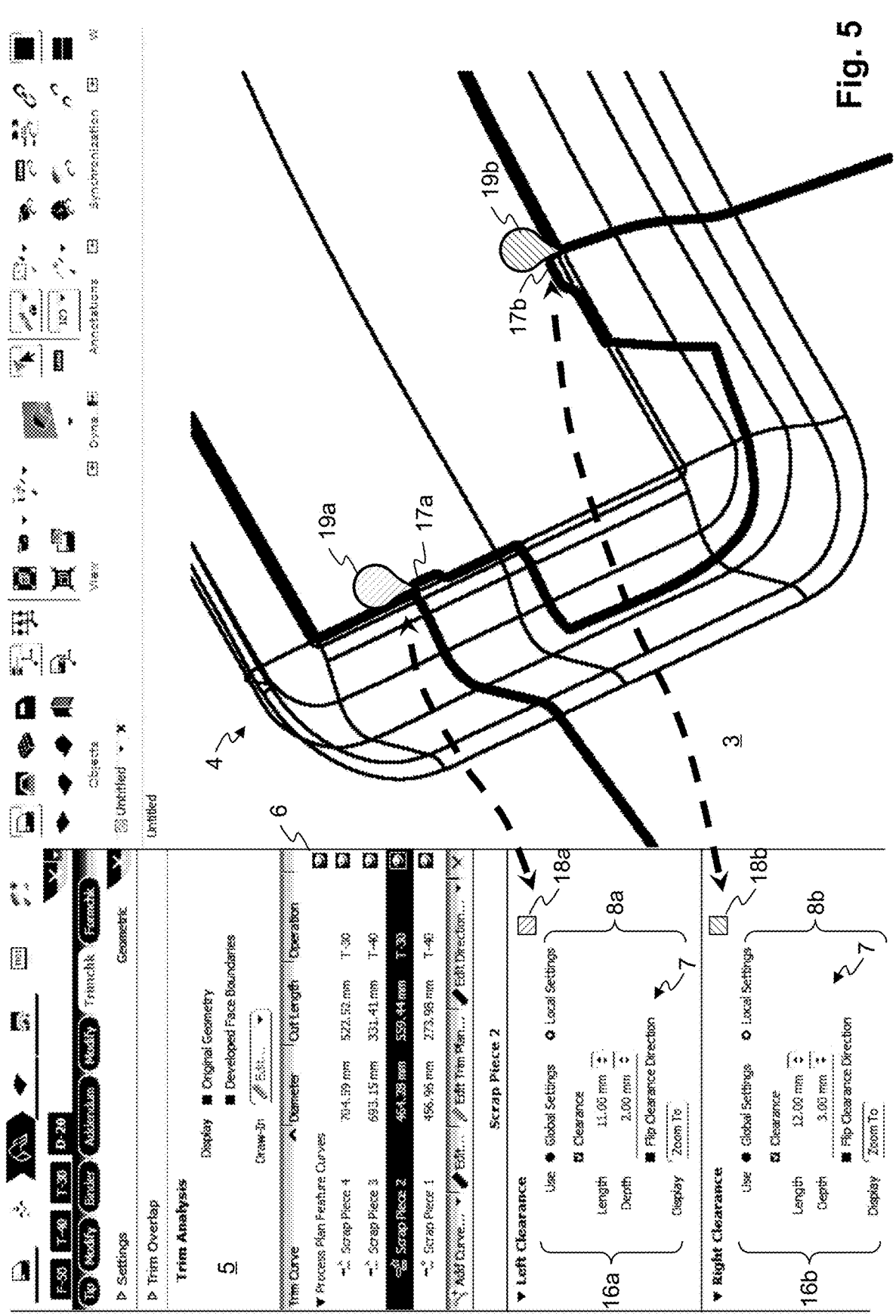
FIG. 5 a third example, in which each widget set comprises multiple widgets.

FIG. 5 shows a third example, in which each widget set 8a, 8b comprises multiple widgets 7. The widgets 7 control dimensions and flags or binary parameters and display control parameters. A first widget set 8a, labelled "Left Clearance" corresponds to a first geometric feature 17a, as indicated by respective first control-related visual marker 18a and first display-related visual marker 19a, and a second widget set 8b labelled "Right Clearance" has associated visual markers 18b, 19b.

While the invention has been described in present embodiments, it is distinctly understood that the invention is not limited thereto, but may be otherwise variously embodied and practised within the scope of the claims.

The invention claimed is:

1. A method for user interaction in a CAE/CAD system for designing physical parts, a physical part being a component shaped by a forming process, or a part assembled in an assembly operation, or a tool used in a forming or an assembly process, a physical part being represented in the CAE/CAD system by a computer-based part model, the method being performed by a processing unit of the CAE/CAD system, the method comprising the steps of:

displaying to a user, on a computer display, a graphical user interface, the graphical user interface comprising a model display region for displaying a graphical model representation of the part model, a control region for displaying widget sets for directly, in the control region, modifying control parameters of control parameter sets controlling operation of the CAE/CAD system, each of the control parameters defining a property of the part model or an operation to be performed on the part model, on the basis of user input actions in the control region, specifying control parameters of the control parameter sets, for modifying the part model, wherein for two or more of the control parameters sets that have modifiable control parameters, each control parameter set corresponds to a different geometric feature of the graphical model representation that is displayed in the model display region, wherein the two or more control parameter sets have the same composition of a plurality of control parameters, wherein each control parameter is associated with a label, wherein two or more widget sets, which each correspond to a respective different one of the two or more control parameter sets, are at the same time in the control region displayed in a state allowing for user input actions for modifying, directly, in the control region, the plurality of control parameters of the respective two or more control parameter sets corresponding to the two or more widget sets being displayed, and visually marked by visual markers in the same manner as is the geometric feature which is displayed in the model display region and which corresponds to the respective control parameter set, and in a different manner than are widget sets and geometric features corresponding to other ones of the two or more control parameter sets, the method thereby visualizing a correspondence between each widget set and the geometric feature controlled by the widget set, and thereby allowing a user to differentiate between widget sets that are displayed at the same time in the control region and allowing for user input actions at the same time, and wherein widgets sets displayed in the control region may be unambiguously assigned to geometric features based on the set of the composition of control parameters and the visual markers.

2. The method of claim 1, further comprising the steps of, for each of the two or more control parameter sets:

displaying within the control region and associated with the control parameter set's widget set, a control-related visual marker, displaying within the model display region and associated with the geometric feature corresponding to the control parameter set, a display-related visual marker, wherein the control-related marker and the display-related marker share one or more visual properties, distinguishing them from markers associated with other control parameter sets.

3. The method of claim 1, wherein, with each control parameter set comprising N control parameters, N being an integer number larger than or equal to two, it is possible to number the control parameters of each parameter set with the numbers from one to N such that over all control parameter sets the control parameters numbered with the same n are of a same type.

4. The method of claim 1, wherein visual properties of visual markers comprise at least one of shape, colour, brightness, pattern.

5. The method of claim 1, comprising the step of displaying a visual marker associated with a widget set or a geometric feature when a mouse event takes place on the widget set or the geometric feature.

6. The method of claim 5, wherein the mouse event is a mouseclick event or wherein it is a mouseover event.

7. The method of claim 1, comprising the step of modifying a visual property of a widget set or of a control-related visual marker in the control region when a mouse event occurs at its corresponding geometric feature.

8. The method of claim 1, comprising the step of modifying a visual property of a geometric feature or of a display-related visual marker in the model display region when a mouse event occurs at its corresponding widget set.

9. A data processing system programmed to perform a method for user interaction in a CAE/CAD system for designing physical parts, a physical part being a component shaped by a forming process, or a part assembled in an assembly operation, or a tool used in a forming or an assembly process, a physical part being represented in the CAE/CAD system by a computer-based part model, the method being performed by a processing unit of the CAE/CAD system, the method comprising the steps of:

displaying to a user, on a computer display, a graphical user interface, the graphical user interface comprising a model display region for displaying a graphical model representation of the part model, a control region for displaying widget sets for directly, in the control region, modifying control parameters of control parameter sets controlling operation of the CAE/CAD system, each of the control parameters defining a property of the part model or an operation to be performed on the part model, on the basis of user input actions in the control region, specifying control parameters of the control parameter sets, for modifying the part model, wherein for two or more of the control parameters sets that have modifiable control parameters, each control parameter set corresponds to a different geometric feature of the graphical model representation that is displayed in the model display region, wherein the two or more control parameter sets have the same composition of a plurality of control parameters, wherein each control parameter is associated with a label, wherein two or more widget sets, which each correspond to a respective different one of the two or more control parameter sets, are at the same time in the control region displayed in a state allowing for user input actions for modifying, directly, in the control region, the plurality of control parameters of the respective two or more control parameter sets corresponding to the two or more widget sets being displayed, and visually marked by visual markers in the same manner as is the geometric feature which is displayed in the model display region and which corresponds to the respective control parameter set, and in a different manner than are widget sets and geometric features corresponding to other ones of the two or more control parameter sets, the method thereby visualizing a correspondence between each widget set and the geometric feature controlled by the widget set, and thereby allowing a user to differentiate between widget sets that are displayed at the same time in the control region and allowing for user input actions at the same time, and wherein widgets sets displayed in the control region may be unambiguously assigned to geometric features based on the set of the composition of control parameters and the visual markers.

10. A non-transitory computer readable medium comprising computer readable program code encoding a computer program that, when loaded and executed on a computer, causes the computer to execute a method for user interaction in a CAE/CAD system for designing physical parts, a physical part being a component shaped by a forming process, or a part assembled in an assembly operation, or a tool used in a forming or an assembly process, a physical part being represented in the CAE/CAD system by a computer-based part model, the method being performed by a processing unit of the CAE/CAD system, the method comprising the steps of:

displaying to a user, on a computer display, a graphical user interface, the graphical user interface comprising a model display region for displaying a graphical model representation of the part model, a control region for displaying widget sets for directly, in the control region, modifying control parameters of control parameter sets controlling operation of the CAE/CAD system, each of the control parameters
defining a property of the part model or an operation
to be performed on the part model,
on the basis of user input actions in the control region,
specifying control parameters of the control parameter sets, for modifying the part model,
wherein for two or more of the control parameters sets
that have modifiable control parameters, each control
parameter set corresponds to a different geometric
feature of the graphical model representation that is
displayed in the model display region,
wherein the two or more control parameter sets have the
same composition of a plurality of control parameters,
wherein each control parameter is associated with a
label,
wherein two or more widget sets, which each correspond
to a respective different one of the two or more control
parameter sets, are at the same time in the control
region
displayed in a state allowing for user input actions for
modifying, directly, in the control region, the plural-
ity of control parameters of the respective two or more control parameter sets corresponding to the two
or more widget sets being displayed, and
visually marked by visual markers
in the same manner as is the geometric feature which
is displayed in the model display region and which
corresponds to the respective control parameter
set, and
in a different manner than are widget sets and geo-
metric features corresponding to other ones of the
two or more control parameter sets,
the method thereby visualizing a correspondence between
each widget set and the geometric feature controlled by
the widget set, and
thereby allowing a user to differentiate between widget
sets that are displayed at the same time in the control
region and allowing for user input actions at the same
time, and wherein widgets sets displayed in the control
region may be unambiguously assigned to geometric
features based on the set of the composition of control
parameters and the visual markers.

* * * * *